(12) United States Patent
Kozinsky et al.

(10) Patent No.: US 9,831,361 B2
(45) Date of Patent: Nov. 28, 2017

(54) METHOD OF FABRICATING NANOCONE TEXTURE ON GLASS AND TRANSPARENT CONDUCTORS

(71) Applicant: Robert Bosch GmbH, Stuttgart (DE)

(72) Inventors: Inna Kozinsky, Mountain View, CA (US); Jonathan P. Mailoa, Cambridge, MA (US); Yun Seog Lee, Cambridge, MA (US)

(73) Assignee: Robert Bosch GmbH, Stuttgart (DE)

( * ) Notice: Subject to any disclaimer, the term of this patent is extended or adjusted under 35 U.S.C. 154(b) by 766 days.

(21) Appl. No.: 13/716,076

(22) Filed: Dec. 14, 2012

(65) Prior Publication Data
US 2014/0166092 A1 Jun. 19, 2014

(51) Int. Cl.
*H01L 31/18* (2006.01)
*H01L 31/0236* (2006.01)

(52) U.S. Cl.
CPC ........ *H01L 31/02366* (2013.01); *H01L 31/18* (2013.01); *Y02E 10/50* (2013.01)

(58) Field of Classification Search
CPC ..................................... H01L 31/18
USPC .......................................... 438/71
See application file for complete search history.

(56) References Cited

U.S. PATENT DOCUMENTS

| | | | |
|---|---|---|---|
| 4,407,695 A * | 10/1983 | Deckman et al. | 216/42 |
| 5,676,853 A * | 10/1997 | Alwan | 216/11 |
| 6,037,104 A * | 3/2000 | Lahaug | 430/314 |
| 6,338,938 B1 * | 1/2002 | Lahaug | 430/314 |
| 6,428,943 B1 * | 8/2002 | Wells et al. | 430/313 |
| 6,495,296 B1 * | 12/2002 | Wells et al. | 430/5 |
| 6,504,180 B1 * | 1/2003 | Heremans et al. | 257/98 |
| 6,521,541 B2 * | 2/2003 | Rossi | 438/710 |
| 6,579,463 B1 * | 6/2003 | Winningham et al. | 216/41 |
| 7,033,936 B1 * | 4/2006 | Green | 438/669 |
| 7,306,743 B2 * | 12/2007 | Hieda et al. | 216/22 |
| 7,385,231 B2 * | 6/2008 | Fujimoto et al. | 257/121 |
| 8,039,292 B2 * | 10/2011 | Guha et al. | 438/98 |
| 8,120,132 B2 * | 2/2012 | Guha et al. | 257/459 |
| 8,137,525 B1 * | 3/2012 | Harreld et al. | 205/75 |
| 8,367,446 B2 * | 2/2013 | Chan et al. | 438/42 |
| 2001/0014426 A1 * | 8/2001 | Michiels et al. | 430/5 |
| 2002/0023894 A1 * | 2/2002 | Rossi | 216/2 |
| 2006/0131261 A1 * | 6/2006 | Green | 216/17 |

(Continued)

FOREIGN PATENT DOCUMENTS

WO WO 2004061980 A1 * 7/2004

OTHER PUBLICATIONS

Tsai et al., Patterned Glass Substrates for Enhanced Solar Energy Harvesting in Thin Film Solar Cells, IEEE, 978-1-4244-9956-6/11, 2011, pp. 945-947.*

(Continued)

*Primary Examiner* — Earl Taylor
(74) *Attorney, Agent, or Firm* — Maginot, Moore & Beck LLP

(57) ABSTRACT

A method of fabricating submicron textures on glass and transparent conductors includes depositing a plurality of silica or silica-coated polystyrene nanospheres onto a substrate, etching the silica coated polystyrene nanospheres and the substrate to form a plurality of nanocone projections on a first side of the substrate, and depositing a transparent conducting oxide onto the substrate on top of the nanocone projections.

9 Claims, 6 Drawing Sheets

(56) References Cited

U.S. PATENT DOCUMENTS

| | | | | |
|---|---|---|---|---|
| 2006/0263642 | A1* | 11/2006 | Hieda et al. | 428/826 |
| 2007/0049047 | A1* | 3/2007 | Fujimoto et al. | 438/759 |
| 2009/0232901 | A1* | 9/2009 | Walt et al. | 424/501 |
| 2009/0269558 | A1* | 10/2009 | Himmelhaus et al. | 428/195.1 |
| 2010/0080954 | A1* | 4/2010 | Mohseni | 428/131 |
| 2010/0175749 | A1* | 7/2010 | Tsutsumi et al. | 136/256 |
| 2011/0111598 | A1* | 5/2011 | Chan et al. | 438/700 |
| 2012/0060905 | A1* | 3/2012 | Fogel et al. | 136/255 |
| 2012/0225517 | A1* | 9/2012 | Zhang et al. | 438/71 |
| 2013/0183791 | A1* | 7/2013 | Nakayama et al. | 438/71 |
| 2013/0284255 | A1* | 10/2013 | Wang et al. | 136/256 |
| 2014/0166092 | A1* | 6/2014 | Kozinsky et al. | 136/256 |

OTHER PUBLICATIONS

Cheung et al., Fabrication of nanopillars by nanosphere lithography, Nanotechnology, 17, 2006, pp. 1339-1343.*

Inns et al., Wafer Surface Charge Reversal as a Method of Simplifying Nanosphere Lithography for Reactive Ion Etch Texturing of Solar Cells, Advances in OptoElectronics, Volum 2007, Article ID 32707, pp. 1-4.*

Kandulski, Shadow Nanosphere Lithography, 2007, pp. 1-81.*

Kosiorek et al., Fabrication of Nanoscale Rings, Dots, and Rods by Combining Shadow Nanosphere Lithography and Annealed Polystyrene Nanosphere Masks, Small, 1, No. 4, 2005, pp. 439-444.*

Zhang et al., Advances in Contemporary Nanosphere Lithographic Techniques, Journal of Nanoscience and Nanotechnology, vol. 6, No. 7, 2006, pp. 1920-1934.*

Chen et al., Using colloidal lithography to fabricate and optimize sub-wavelength pyramidal and honeycomb structures in solar cells, Optics Express, vol. 15, No. 22, 2007, pp. 14793-14803.*

Tan et al., Fabrication of Size-Tunable Gold Nanoparticles Array with Nanosphere Lithography, Reactive Ion Etching, and Thermal Annealing, J. Phys. Chem B, 109, 2005, pp. 11100-11109.*

Xu et al. "Fabrication of raspberry $SiO_2$/polystyrene particles and superhydrophobic particulate film with high adhesive force", J. Mater. Chem., 22, 2012, 5784-5791.*

Zhang et al., "Synthesis of $SiO_2$/Polystyrene Nanocomposite Particles via Miniemulsion Polymerization", Langmuir, 21, 2005, 2124-2128.*

Hsu et al., "Wafer-scale silicon nanopillars and nanocones by Langmuir-Blodgett assembly and etching" Applied Physics Letters, 93, 133109, 2008, 1-3.*

Ding et al., "Silicon dioxide as coating on polystyrene nanoparticles in situ emulsion polymerization", Materials Letters, 58, 2004, 1722-1725.*

Graf et al., "A General Method to Coat Colloidal Particles with Silica", Langmuir, 19, 2003, 6693-6700.*

Subramani, Thiyagu, et al., "Amorphous Silicon Nanocone Array Solar Cell," Nanoscale Research Letters, 2012, 7:172, (6 pages).

Miller, Nate, "Ordered Nanostructure for Organic Photovoltaic Cells," NNIN REU Research Accomplishments, 2004 (2 pages).

Ching-Mei Hsu, et al., "Wafer-scale Silicon Nanopillars and Nanocones by Langmuir-Blodgett Assembly and Etching," Applied Physics Letters 93, 133109, 2008 (3 pages).

* cited by examiner

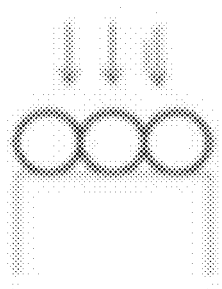 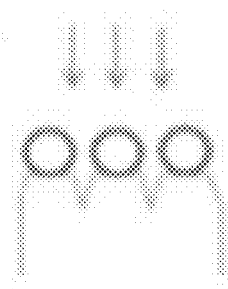 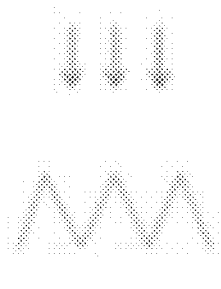
FIG. 6A        FIG. 6B        FIG. 6C
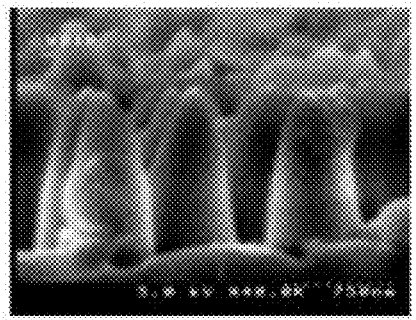
FIG. 7
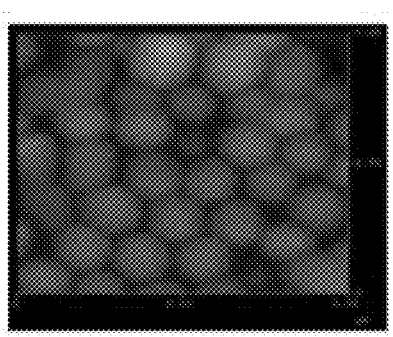
FIG. 8

METHOD OF FABRICATING NANOCONE TEXTURE ON GLASS AND TRANSPARENT CONDUCTORS

TECHNICAL FIELD

The application relates to generally to methods of fabricating submicron textures on glass and transparent conductors, such as used in thin-film solar cells.

BACKGROUND

Glass and transparent conductive films and coatings are used in a wide variety of applications, such as transparent electrodes for flat panel displays, transparent electrodes for photovoltaic cells (solar cells), low emissivity windows, window defrosters, and mobile device displays. Transparent conductors can be manufactured with different optical characteristics depending on the end use. For example, applications such as solar cells and mobile device displays may require transparent conductors with anti-reflective properties in order to increase light absorption (i.e., light trapping) and/or to reduce glare.

One method that is used to increase the anti-reflective properties of transparent conductors is through submicron texturing of the surface of the conductor. The textured surface is used to deflect light into and through the transparent conductor rather than away from the surface of the conductor. This can reduce glare for displays as well as increase the amount of light that can be absorbed in thin film solar cells.

Submicron texturing of substrates is known. However, previously known submicron textures are typically fabricated on silicon and cannot be used for transparent substrates or conductors. Previously known submicron textures have also been fabricated on glass substrates (or quartz/fused silica), but these textures are typically very shallow and therefore are limited in their ability to deflect light toward the substrate for enhancing light absorption.

DRAWINGS

FIGS. 6A-6C depict stages of a RIE process that is used to etch the nanocone texturing into the substrate by controlled destruction of the silica-coated polystyrene spheres.

FIG. 7 is an SEM image showing the nanocone structures that result from the RIE process of FIGS. 6A-6C.

FIG. 8 is an AFM image showing the nanocone texture of the substrate after deposition of a transparent conducting oxide (TCO) film over the substrate.

DESCRIPTION

Figure 1:
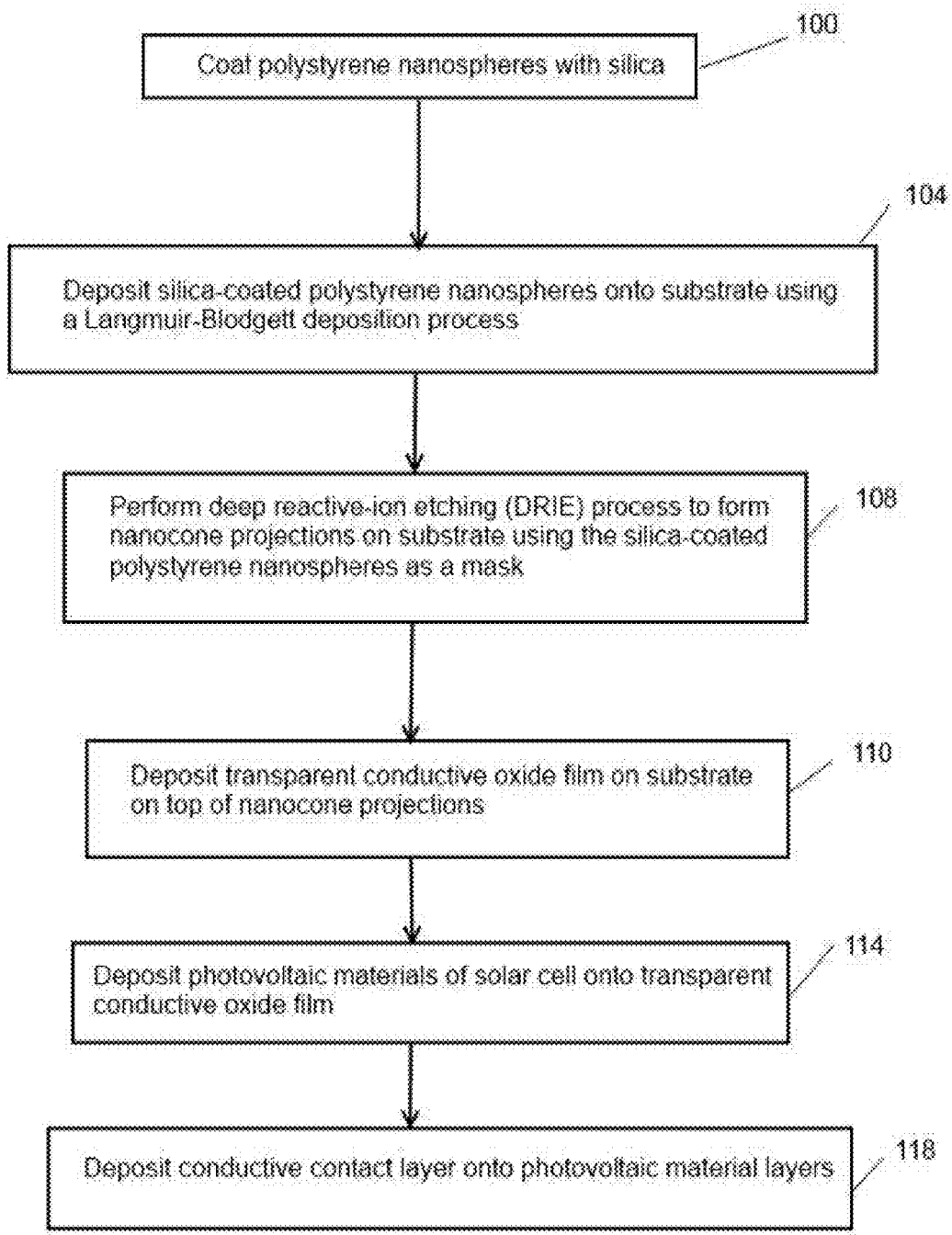
FIG. 1 is a flowchart of a process of fabricating a nanotextured substrate in accordance with the present disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

The present disclosure is directed to a method of fabricating nanotextures, such as nanopillars and nanocones, on transparent conductive substrates, such as glass, fused silica, and quartz, that can be optimized to reduce reflection and maximize light-trapping in the thin absorber layers. The method enables nanopillars and nanocones of high aspect ratios to be formed on the substrate in a highly controlled manner to address the optimal parameters for light absorption in thin film solar cells. This is achieved by effectively grading the index of refraction between the substrate and the absorber using sub-wavelength texturing and ensuring maximal coupling to guided modes in the thin-film absorber layer using textures with optimized period, height, and fill factor.

The proposed method uses silica-coated polystyrene nanospheres ("hybrid nanospheres") deposited on the substrates in closely packed configuration using Langmuir-Blodgett deposition, followed by a reactive-ion etch (RIE) of the substrate to define the nanocone texture. Silica coating on the nanospheres allows for close packing during Langmuir-Blodgett deposition, impossible without it. Polystyrene nanosphere cores allow for high aspect ratio textures since they are etched at a slower rate than silica and glass/quartz/silica substrate.

This method is scalable and is applicable to a variety of glass and transparent conductor applications, including thin-film solar cells, anti-reflective self-cleaning glass, hydrophobic surfaces, anti-fogging windows, anti-fingerprint anti-reflective displays for mobile devices, and the like. The method is applicable to all thin-film solar cell types (e.g., thin-film Si, CIGS, CdTe, CZTS, $Cu_2O$, SnS, other emerging thin-film solar materials) to enhance the absorption by 20-30% and add at least 1-3% to the absolute efficiency. The nanostructured panels can be used as front substrates for solar cells deposited in superstrate configuration (e.g. current thin-film Si modules) or back substrates for solar cells deposited in substrate configuration (e.g. current CIGS and CdTe modules). In a superstrate configuration, the front substrate is used as the supporting structure for the formation and deposition of the semiconductor materials so the materials are deposited in a reverse order, e g., from front to back.

A flowchart of a process of fabricating a nanotextured glass/quartz/fused silica substrate with controllable, high aspect ratio nanocone or nanopillar texturing is depicted in FIG. 1. The process begins with coating polystyrene spheres with silica (block 100). The size of the spheres is selected based on the desired period for the resulting nanocone or nanopillar structures, referred to hereinafter collectively as nanocone structures, formed in the substrate. In one embodiment, the polystyrene spheres are plain polystyrene spheres having a diameter of approximately 750 nm. In alternative embodiments, the polystyrene spheres may have any suitable diameter from tens of nanometers to several micrometers. In alternative embodiments, where shallower textures are needed, silica spheres directly can be used as an etch mask.

Figures 2A, 2B, 2C, 2D:
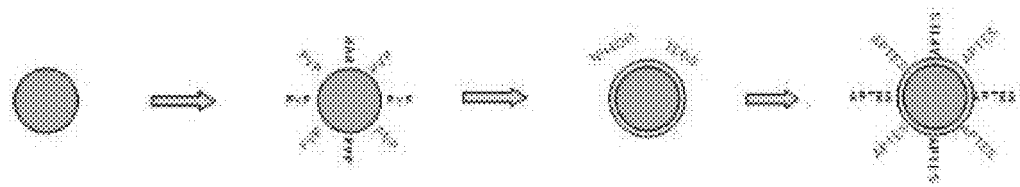
FIGS. 2A-2D depict a process of coating polystyrene spheres with silica.
Figure 3:
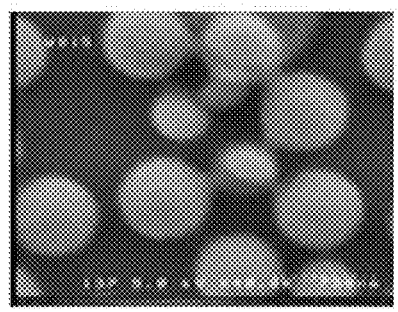
FIG. 3 is an SEM image of polystyrene spheres with silica shells.

FIGS. 2A-2D schematically depict the basic process of coating the polystyrene spheres with silica. The general procedure for silica coating the spheres is described in C. Graf, D. L. J. Vossen, A. Imhof, A. Blaaderen, "A general method to coat colloidal particles with silica," Langmuir 19(17), 6693-6700 (2003). The procedure involves mixing the spheres with polyvinylpyrrolidone (PVP) dissolved ethanol (FIG. 2B). The PVP is be absorbed to the surface to serve as a coupling agent for the silica. The spheres are then mixed with tetraethylorthosilicate (TEOS) and ammonium hydroxide (NH4OH) which results in 10-20 nm thick silica being grown on the PVP-functionalized surface of the sphere (FIG. 2C). The silica-coated spheres are then functionalized for deposition onto the substrate using 3-Aminopropyltriethoxysilane (APTES) (FIG. 2D). FIG. 3 depicts a scanning electron microscope (SEM) image of resulting polystyrene spheres with silica shells.

The silica-coated polystyrene spheres are then deposited onto the substrate in a closely packed configuration using a Langmuir-Blodgett deposition process (block 404). (See, e.g., C.-M. Hsu, S. T. Connor, M. X. Tang, and Y. Cui, "Wafer-scale silicon nanopillars and nanocones by Langmuir-Blodgett assembly and etching," Nano Lett. 93, 133109 (2008); C. P. Collier, R. J. Saykally, J. J. Shiang, S. E. Henrichs, and J. R. Heath, "Reversible tuning of silver quantum dot monolayers through the metal-insulator transition," Science 277, 1978 (1997); and B. O. Dabbousi, C. B. Murray, M. F. Rubner, and M. G. Bawendi, "Langmuir-Blodgett manipulation of size-selected CdSe nanocrystallites," Chem. Mater. 6, 216 (1994)).

Figure 4:
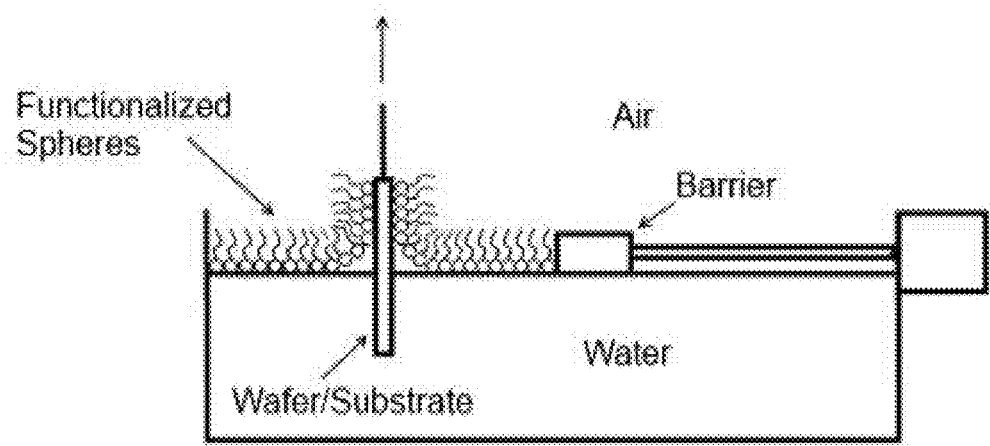
FIG. 4 shows the deposition of the silica-coated polystyrene spheres being deposited onto a substrate using a Langmuir-Blodgett deposition process.
Figure 5:
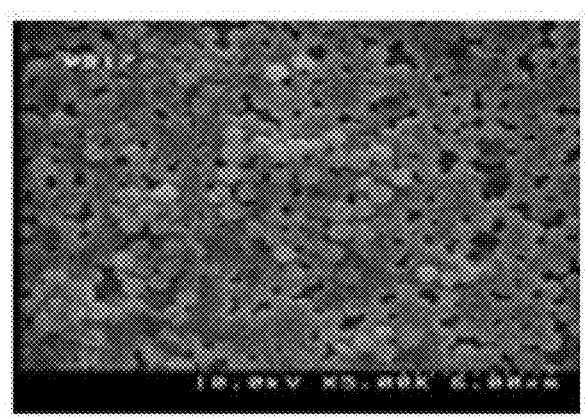
FIG. 5 is an SEM image of the resulting closely packed layer of silica-coated polystyrene spheres on the surface of the substrate.

As depicted in FIG. 4, the Langmuir-Blodgett deposition process involves submerging the substrate (e.g., glass, quartz, fused silica) in a trough filled with a liquid, such as water. The functionalized silica-coated polystyrene spheres are placed in the trough to form a layer on the surface of the liquid. The spheres are deposited onto the substrate as the substrate is slowly withdrawn from the water. The close packing of the spheres on the surface of the water and on the substrate is achieved using a barrier that presses the spheres tightly together on the surface of the water. Silica coating on the nanospheres enables close packing of the spheres on the surface of the substrate that would otherwise be impossible without it. FIG. 5 depicts a SEM image of the resulting closely packed hybrid nanosphere layer on a substrate. As can be seen in FIG. 5, the silica-coated polystyrene spheres form a substantially contiguous layer of material on the surface of the substrate.

Once the closely packed hybrid nanosphere layer is formed on the substrate, a reactive-ion etching (RIE) process is performed on the substrate to create nanocone textures by controlled destruction of nanosphere mask and the substrate material (block 108) as depicted in FIGS. 6A-6C. Reactive-ion etching (RIE) is a highly anisotropic etch process used to create deep penetration, steep-sided holes and trenches in wafers/substrates, typically with high aspect ratios. Polystyrene nanosphere cores allow for high aspect ratio textures since they are etched at a slower rate than silica and glass/quartz/silica substrate. The etching gases, their ratios, and etching time can be used to control the anisotropy vs. the isotropy of the etching process, and therefore the exact aspect ratio and shaping of the resulting nanostructures.

When the RIE process is first performed, the spheres are closely packed and substantially prevent the accelerated ions from reaching and etching the substrate as depicted in FIG. 6A. As the RIE process continues, the silica-coating dissolves and provides a clearance between spheres that widens until the silica coating is gone. The polystyrene cores then begin to dissolve at a slower rate (FIG. 6B). The widening clearance between spheres results in sloped surfaces being etched into the substrate around each sphere that taper to points as the spheres shrink and are dissolved (FIG. 6C). FIG. 7 depicts and SEM image of nanocone structures that result from the use of silica-coated polystyrene spheres as masks for the RIE process. As can be seen in FIG. 7, the use of polystyrene for the core of the spheres allows for high aspect ratio textures since the polystyrene is etched at a slower rate than silica and glass/quartz/silica substrate.

After the RIE process has been performed and the nanocone structuring has been imparted to the substrate, the textured transparent substrate can be incorporated into the manufacturing process to produce a desired end product. As an example, FIG. 1 depicts additional steps that may be undertaken to incorporate the textured transparent substrate into a thin film solar cell. As depicted in FIG. 1, a transparent conducting oxide film, e.g., ZnO:Al, may be deposited onto the substrate on top of the nanocone texturing (block 110). FIG. 8 depicts an atomic force microscope (AFM) of the substrate after the deposition of the TCO film. As can be seen in FIG. 8, the high aspect ratio of the nanocone texturing is still apparent even after the deposition of the TCO film. After the TCO film has been deposited, the photovoltaic materials for implementing the solar cell are deposited onto the TCO film (block 114). A conductive contact layer is then formed on the photovoltaic materials to form the second contact layer for the solar cell. (block 118).

Figure 9:
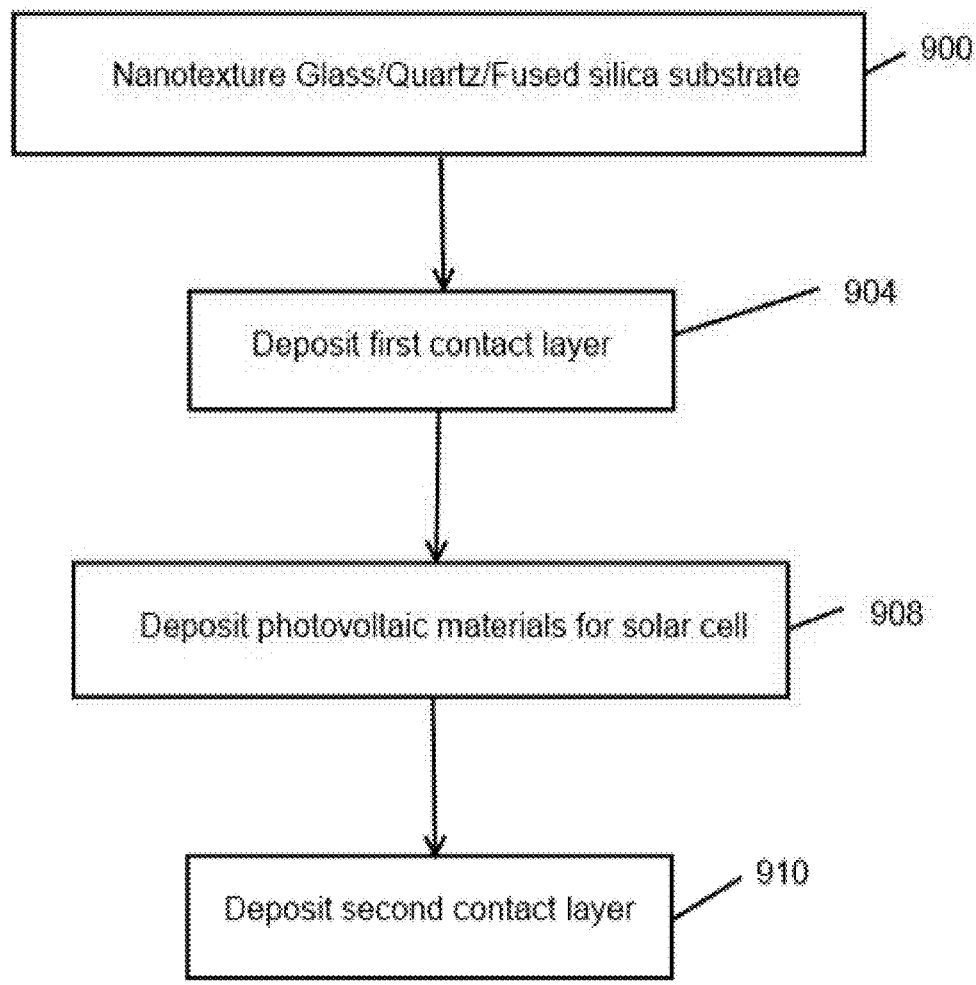
FIG. 9 is a flowchart of a process of fabricating a thin film solar cell including a nanotextured substrate in accordance with the present disclosure.

A flowchart of a process of fabricating a thin film solar cell including a transparent conductor textured as described above is depicted in FIG. 9. The process begins with the nanoscale texturing of a substrate formed of a transparent material, such as glass, quartz, or fused silica (block 900). The nanoscale texturing is used to form nanocone or nanopillar structures on at least one side or both sides of the substrate that have a high aspect ratio (height to width). The resulting nanostructured substrate is then used as a support substrate for the deposition of the thin film photovoltaic materials of the thin film solar cell. Substantially any type of thin film solar cell can be implemented on the nanostructured substrate including, as examples, amorphous silicon (a-Si), thin film silicon (TF-Si), cadmium telluride (CdTe), copper indium gallium selenide (CIGS), copper zinc tin sulfide (CZTS), copper oxide ($Cu_2O$), tin sulfide (SnS), and other emerging thin film technologies.

Depending on the type of thin film solar cell being implemented, the materials for the solar cell are deposited onto the nanostructured substrate in either a superstrate configuration or a substrate configuration. In a superstrate configuration, the nanostructured substrate is used as the front substrate for the solar cell and the materials that form the thin film solar cell are deposited onto the front substrate in reverse order. In a substrate configuration, the nanostructured substrate is used as the back substrate for the solar cell and the materials that form the thin film solar cell are deposited onto the front substrate in order from back to front.

Figure 10:
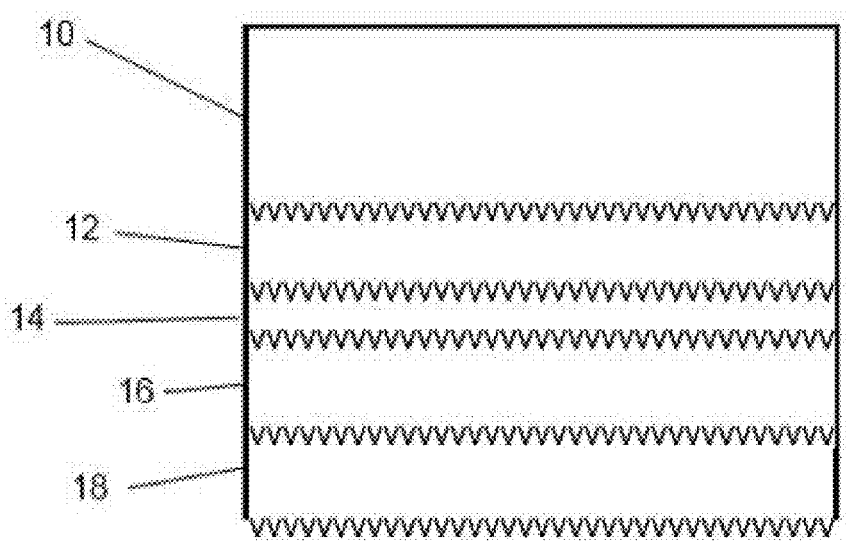
FIG. 10 depicts an embodiment of a thin film solar cell having a nanotextured substrate used as a front substrate in a superstrate configuration (e.g., thin-film silicon cell).
Figure 11:
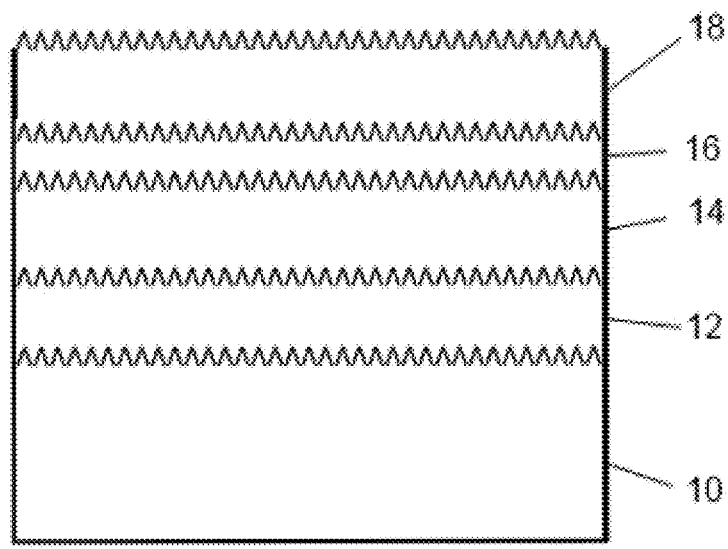
FIG. 11 depicts an embodiment of a thin film solar cell having a nanotextured substrate used as a back substrate in a substrate configuration (e.g, CIGS cell).

The materials used for implementing the thin film solar cell and whether the nanostructured substrate is used in a superstrate or a substrate configuration depends on the type of solar cell that is being fabricated. For example, amorphous silicon and other thin film silicon solar cells may be deposited on the nanotextured substrate in a superstrate configuration (e.g., front to back), CIGS and CdTe thin film solar cells may be deposited on the nanotextured substrate in a substrate configuration (e.g., back to front). FIG. 10 depicts an exemplary embodiment of a thin-film silicon solar cell formed on a nanotextured substrate 10 in superstrate configuration (front side substrate). FIG. 11 depicts an exemplary embodiment of a CIGS thin film solar cell deposited on a nanotextured substrate 10 in a substrate configuration (back side substrate).

In both superstrate and substrate configurations, a first conductive contact layer 12 is deposited onto a major surface of the nanostructured substrate 10 (block 904) that is to be used as either the front side contact or the back side contact for the thin film solar cell for connecting the solar cell to external circuitry, such as a load, or to other solar cells to form a module by sputtering, chemical vapor deposition, or any other suitable deposition method. When the conductive layer 12 is used as the front side contact, the conductive layer 12 may comprise a transparent conductive oxide (TCO) layer, such as zinc oxide (ZnO:Al), or a conducting metal mesh, deposited onto the nanotextured substrate as depicted in FIG. 10. When used as a back side contact as depicted in FIG. 11, the conductive layer may also comprise TCO or may comprise a metal material, such as molydenum (Mo) or aluminum (Al).

After the first conductive layer 12 has been deposited onto the substrate, the thin film photovoltaic materials 14, 16 of the solar cell are deposited onto the first conductive layer 12 (block 908). The photovoltaic materials 14, 16 may be deposited to form a variety of different junction configurations, as known in the art, including p-n, n-p, p-i-n, and n-i-p junctions, alone or in tandem, for both superstrate and substrate deposition.

Once the thin film photovoltaic materials 14, 16 have been deposited onto the first conducting contact layer 12, a second conductive contact layer 18 is deposited onto the photovoltaic materials 14, 16 (block 910). In the superstrate configuration of FIG. 11, the second conducting layer 18 is used as the back side contact for the solar cell and may be formed of a transparent conductive oxide (TCO) material or a conductive metal material, such as aluminum, that covers the entire surface of the cell. If the back side contact is transparent, a layer of non-transparent material may be deposited onto the back side contact to form a reflective barrier that reflects light back up toward the photovoltaic materials of the solar cell. In the substrate configuration of FIG. 11, the second conducting layer 18 may comprise a transparent conducting oxide (TCO) for connecting the solar cell to electrical circuitry. Alternatively, a conductive metal grid (not shown) may be formed on top of the solar cell for connecting the solar cell to circuitry.

Although not depicted in FIGS. 10 and 11, various other layers and coatings may be included in the process for enhancing various properties or limiting others. For example, anti-reflection layer coatings may be provided between the photovoltaic material layers and the TCO layers and/or between the TCO layers and the nanotextured substrate. Other types of conductive contact layers as well as transparent contact layers may also be utilized. FIGS. 10 and 11 are examples of solar cells that can be implemented on a nanotextured glass/quartz/fused silica substrate in accordance with the present disclosure and are not meant to be limiting as to the specific structure of the solar cell.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of fabricating a nanotextured conducting panel comprising:
   depositing a plurality of silica-coated polystyrene nanospheres onto a substrate,
   etching the silica coated polystyrene nanospheres and the substrate to form a plurality of nanocone projections on a first side of the substrate, and
   depositing a transparent conducting oxide onto the substrate on top of the plurality of nanocone projections.

2. The method of claim 1, further comprising:
   depositing photovoltaic materials onto the transparent conducting oxide to form a thin film solar cell.

3. The method of claim 2, wherein the photovoltaic materials include thin-film amorphous or microcrystalline silicon.

4. The method of claim 2, wherein the photovoltaic materials include copper indium gallium selenide (CIGS).

5. The method of claim 1, wherein the plurality of silica coated polystyrene nanospheres are deposited onto the substrate using a Langmuir-Blodgett deposition process.

6. The method of claim 5, wherein the deposited silica coated polystyrene nanospheres form a substantially contiguous layer of material on the surface of the substrate.

7. The method of claim 6, wherein the polystyrene nanospheres have a diameter of approximately 750 nm.

8. The method of claim 1, wherein the substrate is formed of glass, quartz, or fused silica.

9. The method of claim 1, wherein the etching of the silica coated polystyrene nanospheres and the substrate comprises a reactive-ion etching process.

* * * * *